United States Patent [19]

Tanaka et al.

[11] Patent Number: 5,543,268
[45] Date of Patent: Aug. 6, 1996

[54] DEVELOPER SOLUTION FOR ACTINIC RAY-SENSITIVE RESIST

[75] Inventors: Hatsuyuki Tanaka, Chigasaki; Mitsuru Sato, Zama; Toshimasa Nakayama, Hiratsuka; Hiroshi Komano, Kanagawa-ken, all of Japan

[73] Assignee: Tokyo Ohka Kogyo Co., Ltd., Kanagawa-ken, Japan

[21] Appl. No.: 231,877

[22] Filed: Apr. 22, 1994

Related U.S. Application Data

[63] Continuation of Ser. No. 882,854, May 14, 1992, abandoned.

[51] Int. Cl.$^6$ .................................................. G03F 7/32
[52] U.S. Cl. .................... 430/331; 430/309; 430/325; 430/326
[58] Field of Search .................................. 430/331, 325, 430/326, 309, 302; 252/544, 542, 547, 548, 558

[56] References Cited

U.S. PATENT DOCUMENTS

| | | | |
|---|---|---|---|
| 4,576,903 | 3/1986 | Baron et al. | 430/331 |
| 4,610,953 | 9/1986 | Hashimoto et al. | 430/326 |
| 4,762,771 | 8/1988 | Matsumoto et al. | 430/302 |
| 4,820,621 | 4/1989 | Tanaka et al. | 430/331 |
| 4,880,724 | 7/1989 | Toyama et al. | 430/331 |

FOREIGN PATENT DOCUMENTS

| | | |
|---|---|---|
| 61-18944 | 1/1986 | Japan . |
| 61-167948 | 7/1986 | Japan . |
| 61-151537 | 7/1986 | Japan . |
| 1367830 | 9/1974 | United Kingdom . |

*Primary Examiner*—Janis L. Dote

[57] ABSTRACT

Disclosed is a novel aqueous developer solution used in the development treatment of an actinic ray-sensitive resist for the manufacture of, for example, semiconductor devices, which is capable of giving a patterned resist layer free from the troubles of film residue or scum deposition in any finest patterning. The developer solution contains, in addition to a nitrogen-containing organic basic compound, e.g., tetramethyl ammonium hydroxide, dissolved in an aqueous medium as the solvent, an anionic surface active agent which is a diphenyl ether compound having at least one ammonium sulfonate group, such as an ammonium alkyl diphenylether sulfonate, in a concentration of 0.05 to 5% by weight.

9 Claims, No Drawings

DEVELOPER SOLUTION FOR ACTINIC RAY-SENSITIVE RESIST

This application is a continuation of Ser. No. 07/882,854 filed May 14, 1992, which is now abandoned.

BACKGROUND OF THE INVENTION

The present invention relates to a novel developer solution for an actinic ray-sensitive resist. More particularly, the invention relates to a practically useful developer solution for an actinic ray-sensitive resist capable of forming a finely patterned resist layer without film residue or deposition of scum and giving a high resolution of the pattern even in and around an extremely fine through-hole without decreasing the heat resistance of the patterned resist layer.

It is a well established technology, in the manufacture of semiconductor-based integrated circuits as well as masks for the manufacture thereof, printed circuit boards, planographic printing plates and the like, to use a so-called actinic ray-sensitive resist, which is a material having sensitivity to various kinds of actinic rays such as ultraviolet light, X-rays, electron beams and the like with an object to selectively or pattern-wise protect the surface of the substrate which undergoes a pattern-wise treatment of etching, diffusion and so on. Thus, the substrate surface is coated all over with a resist composition to form a coating layer of the resist which is then irradiated pattern-wise with actinic rays to form a latent image of the pattern followed by a development treatment with a developer solution, which pattern-wise dissolves away the resist layer, to form a patterned resist layer which serves for the protection of the substrate surface.

The actinic ray-sensitive resist materials can be classified into positive-working and negative-working ones depending on the types of the sensitivity characteristics to the actinic rays. Namely, a positive-working resist is imparted with increased solubility in the developer solution in the areas of the resist layer exposed to the actinic rays so that the resist layer in the unirradiated areas remains undissolved by the development treatment. The solubility behavior of a negative-working resist is reverse to that of the positive-working one.

Among the various types of the developer solutions used in the development treatment of a resist layer, most conventional are aqueous alkaline solutions prepared by dissolving an alkaline substance in water or a liquid mixture mainly composed of water. It is well known that, when the developer solution is to be used in the manufacturing process of semiconductor silicon-based devices, the alkalinity of the developer solution cannot be made by using an alkaline compound containing a metallic element such as sodium since contamination of semiconductor silicon with sodium causes adverse influences on the characteristic performance of the semiconductor devices. Therefore, it is conventional to prepare an aqueous alkaline developer solution by using an organic basic compound containing no metallic element such as quaternary ammonium hydroxide including tetramethyl ammonium hydroxide disclosed in IBM Technical Disclosure Bulletin, volume 3, No. 7, page 2009 (1970) and choline, i.e. trimethyl 2-hydroxyethyl ammonium hydroxide, disclosed in U.S. Pat. No. 4,239,661.

Along with the recent trend toward a higher and higher density of integration in semiconductor devices, the requirement for the fineness of patterning is increasing to such an extent that the line width of the patterned resist layer should be 1 μm or even smaller. A proposal has been made, for example, in U.S. Pat. No. 4,820,621 according to which an aqueous alkaline developer solution mentioned above is admixed with a non-ionic surface active agent, such as alkylphenol polyethylates, in order to improve the wetting behavior of the resist surface with the aqueous solution in any finest pattern, especially, for patterning of very fine through-holes. When patterning of a resist layer is undertaken by using such a developer solution containing a nonionic surface active agent, occurrence of film residue or deposition of scum is sometimes unavoidable on the resist layer after development to cause a serious drawback in fine patterning for the manufacture of semiconductor devices. This problem can be partly solved by undertaking an overly exposure or overly development but no complete solution of the problem can be obtained thereby.

It is usually practiced that the film residue or scum is removed by subjecting the patterned resist layer on the substrate surface after development of the resist layer by lightly subjecting the resist layer to exposure to oxygen plasma or to a sputtering treatment. This measure, however, causes another problem that the shoulder portions in the cross sectional profile of a line pattern of the resist layer are rounded resulting in a decrease of the protecting performance of the resist layer or poor reproduction of the desired pattern. In particular, the treatment with oxygen plasma has a problem in the poor controllability of the plasma generation and, in addition, removal of scum can never be complete in and around very fine through-holes of a dimension of 1 μm or finer in diameter due to the poor uniformity of the plasma treatment.

Alternatively, Japanese Patent Kokai No. 61-167948 proposes admixture of an aqueous alkaline developer solution with a non-ionic surface active agent of a different type such as polyoxyethylene nonylphenyl ether. Although the problem of deposition of scum or occurrence of film residue after development can be solved at least partly, another problem arises thereby that the heat resistance of the patterned resist layer may be adversely influenced so that fidelity of the pattern reproduction is decreased in the heat treatment of the patterned resist layer after development.

SUMMARY OF THE INVENTION

The present invention has an object, in view of the above described situations, to provide an aqueous developer solution for an actinic ray-sensitive resist layer containing an organic basic compound capable of forming a very finely patterned resist layer having line patterns or through-holes with a dimension of 1 μm or smaller without deposition of scum or occurrence of film residue after development and without decreasing the heat resistance of the patterned resist layer to withstand the heat treatment undertaken after the development treatment.

Thus, the developer solution for an actinic ray-sensitive resist layer of the present invention comprises:

(a) water or a liquid mixture mainly composed of water as a solvent;

(b) a nitrogen-containing organic basic compound dissolved in the solvent in a concentration in the range from 1 to 5% by weight; and (c) an anionic surface active agent which is a derivative of diphenyl ether represented by the general formula

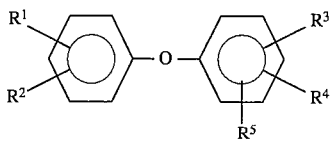

in which $R^1$ is an alkyl or alkoxy group having 5 to 18 carbon atoms, $R^2$ is a hydrogen atom or an alkyl or alkoxy group having 5 to 18 carbon atoms, $R^3$ is an N-substituted or unsubstituted ammonium sulfonate group of the general formula $$—SO_3NR^6{}_4, \qquad (II)$$

each $R^6$ being, independently from the others, a hydrogen atom, alkyl group or hydroxyalkyl group, and $R^4$ and $R^5$ are each a hydrogen atom or an N-substituted or unsubstituted ammonium sulfonate group of the general formula (II) given above, dissolved in the solvent in a concentration in the range from 0.05 to 5% by weight.

DETAILED DESCRIPTION OF THE PREFERRED EMBODIMENTS

As is described above, the essential ingredients in the inventive developer solution include the components (a), (b) and (c), of which the most characteristic ingredient is the specific anionic surface active agent as the component (c).

The solvent as the major constituent, i.e. component (a), of the inventive developer solution is water or a liquid mixture composed mainly of water or, for example, of 50% by weight or more of water with admixture of one or more of water-miscible organic solvents in a minor amount.

The nitrogen-containing organic basic compound as the component (b) should be free from metallic ions and can be any one of those conventionally used in aqueous alkaline developer solutions including primary, secondary and tertiary aryl or alkyl amine compounds, of which the alkyl groups can be straightly linear, branched or cyclic, heterocyclic nitrogen-containing basic compounds, which may contain one or two atoms of oxygen and/or sulfur in the ring structure formed from 3 to 5 carbon atoms, and quaternary lower-alkyl or -hydroxyalkyl ammonium hydroxide compounds. Examples of the amine compounds include 1,3-diaminopropane, 4,4'-diamino-diphenyl amine, di(ω-amino-n-alkyl)amines and the like. Examples of the nitrogen-containing heterocyclic basic compounds, of which the ring structure contains 3 to 5 carbon atoms, one or more of nitrogen atoms and, optionally, oxygen and/or sulfur atoms, include pyrrole, pyrrolidine, pyrrolidone, pyridine, morpholine, pyrazine, piperidine, oxazole, thiazole and the like. Examples of the quaternary lower-alkyl ammonium hydroxide compounds include tetramethyl ammonium hydroxide, trimethyl 2-hydroxyethyl ammonium hydroxide, i.e. choline, and the like. The above named two quaternary ammonium hydroxides are particularly preferable and tetramethyl ammonium hydroxide is the most preferable. These organic basic compounds can be used either singly or as a combination of two kinds or more according to need. The concentration of the organic basic compound in the inventive aqueous developer solution is in the range, usually, from 1 to 5% by weight or, preferably, from 1 to 3% by weight or, more preferably, from 1.5 to 2.5% by weight.

The component (c), which is the most characteristic ingredient in the inventive developer solution, is a specific diphenyl ether compound of the general formula (I) given above having anionic surface activity. In the general formula (I), $R^1$ is an alkyl or alkoxy group having 5 to 18 carbon atoms such as pentyl, hexyl, heptyl, octyl, nonyl, dodecyl, pentadecyl, stearyl, pentoxy, hexoxy, heptoxy, octoxy, nonyloxy, dodecyloxy, pentadecyloxy and stearyloxy groups and $R^2$ is a hydrogen atom or an alkyl or alkoxy group having 5 to 18 carbon atoms which can be the same as $R^1$ exemplified above. It is essential that the diphenyl ether compound of the general formula (I) has at least one N-substituted or unsubstituted ammonium sulfonate group. Namely, the group denoted by $R^3$ is a group of the general formula (II) given above, in which each $R^6$ is, independently from the others, a hydrogen atom, alkyl group, e.g., methyl, ethyl and propyl groups, hydroxyalkyl group, e.g., hydroxymethyl and 2-hydroxyethyl groups. The groups denoted by $R^4$ and $R^5$ are each a hydrogen atom or an N-substituted or unsubstituted ammonium sulfonate group which can be the same as the $R^8$ defined above.

Examples of the diphenyl ether compound suitable as the component (c) include:

ammonium 4-pentyl diphenylether-4'-sulfonate;

tetramethyl ammonium 4-heptyl diphenylether-4'-sulfonate;

trimethyl 2-hydroxyethyl ammonium 4-pentyl diphenylether-4'-sulfonate;

triethyl ammonium 4-pentyl diphenylether-4'-sulfonate;

ammonium 4-dodecyl diphenylether-4'-sulfonate;

diammonium 4-dodecyl diphenylether-2',4'-disulfonate;

bis(di-2-hydroxyethyl ammonium) 4-dodecyl diphenylether-2',4'-disulfonate;

bis(tetramethyl ammonium) 4-dodecyl diphenylether-2',4'-disulfonate;

ammonium 4-pentadecyl diphenylether-4'-sulfonate;

ammonium 2,4-dinonyl diphenylether-4'-sulfonate;

ammonium 4-octyl diphenylether-4'-sulfonate;

tetramethyl ammonium 4-pentadecyl diphenylether-4'-sulfonate; and ammonium 4-pentoxy diphenylether-4'-sulfonate.

Among the above named diphenylether compounds, the disulfonate compounds, in which the group denoted by $R^1$ is an alkyl group and the group denoted by $R^2$ is a hydrogen atom, are preferred. Those diphenyl ether compounds, of which each of $R^3$ and $R^4$ is a group of the formula -$SO_3NH_4$, are more preferable.

These diphenyl ether compounds having good solubility in water or a liquid mixture mainly composed of water can be used either singly or as a combination of two kinds or more according to need. The concentration of the component (c) contained in the inventive developer solution is in the range, usually, from 0.05 to 5% by weight or, preferably, from 0.1 to 3% by weight. When the concentration is too low, the improvement in the wetting behavior of the surface is poor as a matter of course to cause a decrease in the resolution of the pattern while, when the concentration thereof is too high, the selectivity in the solubility behavior would be poor between the areas irradiated and unirradiated with actinic rays and also degradation is caused in the heat resistance of the patterned resist layer obtained by the development treatment.

It is optional according to need that, besides the above described essential ingredients, the inventive developer solution is admixed with various kinds of known additives conventionally used in aqueous alkaline developer solutions in the prior art including, for example, wetting agents, stabilizers, solubility aids, cationic surface active agents and so on each in a limited amount.

The inventive developer solution can be readily prepared by dissolving the components (b) and (c) together with other optional ingredients in the component (a) as the solvent. By virtue of the unique surface activity of the component (c), the developer solution has good penetrability to the resist layer as well as good detergency and dissolving power so that the patterned resist layer formed by the development treatment therewith is completely freed from occurrence of film residue or deposition of scum even in the finest patterns. Moreover, absolutely no adverse influences are caused on the heat resistance of the patterned resist layer obtained by using the inventive developer solution.

In the following, the developer solution of the invention is described in more detail by way of examples and comparative examples, which, however, never limit the scope of the invention in any way.

EXAMPLE 1

(Experiments No. 1 to No. 14).

In each of the Experiments No. 1 to No. 12, a developer solution was prepared by dissolving tetramethyl ammonium hydroxide in water in a concentration of 2.38% by weight with further admixture of one or a combination of two kinds of the anionically surface-active diphenyl ether compounds (A) to (M) indicated below in a concentration of 0.1 to 1.0% by weight as indicated in the table below:

(A): ammonium 4-pentyl diphenylether-4'-sulfonate;
(B): tetramethyl ammonium 4-heptyl diphenylether-4'-sulfonate;
(C): trimethyl 2-hydroxyethyl ammonium 4-pentyl diphenylether-4'-sulfonate;
(D): triethyl ammonium 4-pentyl diphenylether-4'-sulfonate;
(E): ammonium 4-dodecyl diphenylether-4'-sulfonate;
(F): diammonium 4-dodecyl diphenylether disulfonate;
(G): bis(di-2-hydroxyethyl ammonium) 4-dodecyl diphenylether-2',4'-disulfonate;
(H): bis(tetramethyl ammonium) 4-dodecyl diphenylether disulfonate;
(I): ammonium 4-pentadecyl diphenylether-4'-sulfonate;
(J): ammonium 2,4-dinonyl diphenylether-4'-sulfonate;
(K): ammonium 4-octyl diphenylether-4'-sulfonate;
(L): tetramethyl ammonium 4-pentadecyl diphenylether-4'-sulfonate; and
(M): ammonium 4-pentoxy diphenylether-4'-sulfonate.

The developer solution prepared in Experiment No. 13 was not admixed with a surface active agent while the developer solution prepared in Experiment No. 14 contained 0.5% by weight of a polyoxyethylene 4-nonylphhenyl ether, of which the polyoxyethylene chain contained 10 oxyethylene units on an average, which is referred to as (N) in the table, in place of the component (c).

A semiconductor silicon wafer of 4 inch diameter was coated on a spinner with a positive-working photoresist composition (TSMR-V3, a product by Tokyo Ohka Kogyo Co.), which contained a novolac resin and a naphthoquinone diazide compound, in a thickness of 1.3 μm as dried followed by a pre-baking treatment on a hot plate at 90° C. for 90 seconds to form a photoresist layer.

The thus formed photoresist layer was exposed patternwise to ultraviolet light on a minifying exposure machine (Model NSR-1505G7E, manufactured by Nikon Co.) through a test chart reticle and then subjected to a heat treatment on a hot plate at 110° C. for 60 seconds. Thereafter, a development treatment was undertaken with the developer solution prepared above at a temperature of 23° C. for 65 seconds by using a static-paddle development apparatus followed by rinse of the silicon wafer for 30 seconds in a running stream of deionized water and drying.

The patterned resist layer thus formed was examined for the relative sensitivity to ultraviolet light to give the results shown in the table taking the value in Experiment No. 13 as 1.00. The patterned resist layers were inspected for the occurrence of film residue and deposition of scum to find that the resist layers in Experiments No. 1 to No. 12 and No. 14 were all in a very satisfactory condition while a small amount of film residue or scum deposition was found on the patterned resist layer in Experiment No. 13.

Further, the silicon wafer bearing the patterned resist layer was heated for 5 minutes on a hot plate at 100° C. to examine the change caused in the cross sectional profile of a line pattern having a width of 1.5 μm. The results were that no changes were noted in each of Experiments No. 1 to No. 12 while some deformation was noted in the cross sectional profile of the line pattern in Experiments No. 13 and No. 14.

EXAMPLE 2

A photoresist composition was prepared by dissolving, in 250 parts by weight of ethylene glycol monoethyl ether, 100 parts by weight of a cresol novolac resin having a weight-average molecular weight of about 8000 obtained from a 6:4 mixture of m-cresol and p-cresol, 15 parts by weight of an ester of naphthoquinone-1,2-diazide-5-sulfonic acid with 2,3,4-trihydroxybenzophenone and 25 parts by weight of a poly(vinyl methyl ether) resin having a weight-average molecular weight of about 100,000 followed by filtration of the solution through a membrane filter having a pore diameter of 3.0 μm.

A silicon wafer provided with a 1 μm thick plating layer of gold by the sputtering method was coated with the above prepared photoresist composition in a coating thickness of 25 μm as dried on a spinner followed by a pre-baking treatment in a hot-air circulating oven at 90° C. for 40 minutes to form a resist layer.

Thereafter, the photoresist layer was exposed to ultraviolet light on a mirror-projection exposure machine (Model HMW-661B, manufactured by ORC Co.) through a bump-plating test chart for 40 seconds at an illuminance of 17 mW/cm$^2$ as measured with an ultraviolet illumination meter (Model UV-MO2, manufactured by ORC Co.) equipped with an ultraviolet sensor UV 35.

Development of the thus ultraviolet-irradiated photoresist layer was undertaken in a reciprocally moving bath of an aqueous developer solution containing 2.75% by weight of tetramethyl ammonium hydroxide and 2.00% by weight of the diphenyl ether compound (F) used in Experiment No. 6 of Example 1 at 25° C. for 150 seconds followed by rinse in a running stream of deionized water for 30 seconds and drying.

Microscopic examination of the patterned resist layer thus obtained indicated absolutely no deposition of scum with a very little decrement in the thickness of the resist layer remaining undissolved by the developer solution.

The patterned resist layer was subjected to electrolytic plating at 60° C. for 1 hour at a current density of 0.4 A/dm$^2$ in a bath of a non-cyanide electrolytic plating solution (Neutronics 210, a product by Tanaka Kikinzoku Co.) to form a gold-bump pattern having a uniform thickness of 25 μm.

For comparison, the same experiment as above was repeated excepting omission of the diphenyl ether compound as a surface active agent in the developer solution. The result was that the uniformity of the gold plating layer was definitely poor due to deposition of scum on the patterned resist layer or due to the uneven decrease in the film thickness.

EXAMPLE 3

The same experiment as in Example 2 described above was repeated excepting replacement of the poly(vinyl methyl ether) resin with the same amount of an acrylic copolymer of methacrylic acid, methyl methacrylate and butyl acrylate having a weight-average molecular weight of 60,000. The result was as good as in Example 2 to give a quite satisfactory gold-bump plated pattern of the resist layer.

TABLE 1

| Experiment | Surface active agent | | Relative sensitivity |
|---|---|---|---|
| | Kind | Concentration, % by weight | |
| 1 | A | 0.1 | 0.95 |
| 2 | B | 0.2 | 0.98 |
| 3 | C | 0.3 | 0.93 |
| 4 | D | 0.5 | 0.90 |
| 5 | E | 0.2 | 0.96 |
| 6 | F | 0.3 | 0.90 |
| 7 | G | 0.5 | 0.91 |
| 8 | H | 0.4 | 0.90 |
| 9 | I | 1.0 | 0.97 |
| 10 | J | 0.8 | 0.92 |
| 11 | K | 0.25 | 0.93 |
| | L | 0.25 | |
| 12 | M | 0.5 | 0.90 |
| 13 | None | — | 1.00 |
| 14 | N | 0.5 | 0.95 |

What is claimed is:

1. A developer solution for an actinic ray -sensitive resist layer which comprises:

(a) water or a liquid mixture mainly composed of water as a solvent;

(b) a nitrogen-containing organic basic compound dissolved in said solvent in a concentration of from 1 to 5% by weight; and (c) an anionic surface active agent which is a diphenyl ether compound represented by the general formula:

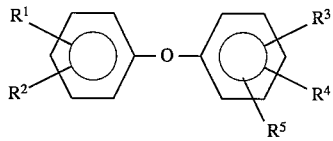

in which $R^1$ is an alkyl or alkoxy group having 5 to 18 carbon atoms, $R^2$ is a hydrogen atom or an alkyl or alkoxy group having 5 to 18 carbon atoms, $R^3$ is an N-substituted ammonium sulfonate group of the general formula:

$$-SO_3 NR^6{}_4$$

each $R^6$ being, independent from the others, a methyl, ethyl, hydroxymethyl or 2-hydroxyethyl group and $R^4$ and $R^5$ are each a hydrogen atom or an N-substituted ammonium sulfonate group of the general formula $SO_3NR^6{}_4$, $R^6$ having the same meaning as defined above, dissolved in the solvent in a concentration in the range from 0.05 to 5% by weight.

2. The developer solution for an actinic ray-sensitive resist layer as claimed in claim 1 in which the nitrogen-containing organic basic compound as the component (b) is a lower-alkyl quaternary ammonium compound selected from the group consisting of tetramethyl ammonium hydroxide, trimethyl 2-hydroxyethyl ammonium hydroxide and mixtures thereof.

3. The developer solution for an actinic ray-sensitive resist layer as claimed in claim 2 in which the lower-alkyl quaternary ammonium compound is tetramethyl ammonium hydroxide.

4. The developer solution for an actinic ray-sensitive resist layer as claimed in claim 1 in which $R^6$ is a methyl group.

5. The developer solution for an actinic ray-sensitive resist layer as claimed in claim 1 in which $R^6$ is an hydroxymethyl group.

6. The developer solution for an actinic ray-sensitive resist layer as claimed in claim 1 in which the concentration of the component (c) is in the range from 0.1 to 3% by weight.

7. The developer solution for an actinic ray-sensitive resist layer as claimed in claim 1 in which $R^1$ is an alkyl group or alkoxy group having 5 to 18 carbon atoms, $R^2$ is hydrogen, $R^5$ is hydrogen and the group denoted by $R^4$ is the N-substituted ammonium sulfonate group of the general formula.

8. The developer solution for an actinic ray-sensitive resist layer as claimed in claim 1 in which $R^6$ is an ethyl group.

9. The developer solution for an actinic ray-sensitive resist layer as claimed in claim 1 in which $R^6$ is a 2-hydroxyethyl group.

* * * * *